(12) United States Patent
Park et al.

(10) Patent No.: US 11,917,915 B2
(45) Date of Patent: Feb. 27, 2024

(54) PSEUDO-TERNARY THERMOELECTRIC MATERIAL, METHOD OF MANUFACTURING THE SAME, THERMOELECTRIC ELEMENT, AND THERMOELECTRIC MODULE

(71) Applicant: HYLIUM INDUSTRIES, INC., Gyeonggi-do (KR)

(72) Inventors: Sung Hoon Park, Incheon (KR); Seo Young Kim, Gyeonggi-do (KR)

(73) Assignee: HYLIUM INDUSTRIES, INC., Gyeonggi-do (KR)

( * ) Notice: Subject to any disclaimer, the term of this patent is extended or adjusted under 35 U.S.C. 154(b) by 135 days.

(21) Appl. No.: 16/928,829

(22) Filed: Jul. 14, 2020

(65) Prior Publication Data

US 2021/0265548 A1 Aug. 26, 2021

(30) Foreign Application Priority Data

Feb. 24, 2020 (KR) .................. 10-2020-0022331

(51) Int. Cl.
*H10N 10/852* (2023.01)
*H10N 10/17* (2023.01)
(Continued)

(52) U.S. Cl.
CPC ......... *H10N 10/852* (2023.02); *C04B 35/547* (2013.01); *C04B 35/6261* (2013.01);
(Continued)

(58) Field of Classification Search
CPC ....... H01L 35/16; H01L 35/32; H10N 10/852; H10N 10/17; C04B 2235/446;
(Continued)

(56) References Cited

U.S. PATENT DOCUMENTS

2007/0095383 A1* 5/2007 Tajima .................... H01L 35/34
136/238
2013/0164165 A1* 6/2013 Yeh ........................ C04B 35/547
75/352

(Continued)

FOREIGN PATENT DOCUMENTS

JP 2002111086 A 4/2002
KR 10-1367719 B1 2/2014
(Continued)

OTHER PUBLICATIONS

Choi, Jong-Il et al. Chromosome 4q25 variants and biomarkers of myocardial fibrosis in patients with atrial fibrillation, Journal of Cardiovascular Electrophysiology, 2019; 30: 1904-1913.

*Primary Examiner* — Uyen M Tran
(74) *Attorney, Agent, or Firm* — Casimir Jones, S.C.; Tanya A. Arenson

(57) ABSTRACT

Disclosed are a pseudo-ternary thermoelectric material, a method of manufacturing the pseudo-ternary thermoelectric material, a thermoelectric element, and a thermoelectric module. The pseudo-ternary thermoelectric material includes bismuth (Bi), antimony (Sb), tellurium (Te), and selenium (Se), and a composition ratio thereof is $Bi_xSb_{2-x}Te_3$ in which $0.3 \leq x \leq 0.6$ or $(Bi_2Te_3)_{1-x-y}(Sb_2Te_3)_x(Sb_2Se_3)_y$, in which $0<x<1$ and $0.001 \leq y \leq 0.05$.

6 Claims, 16 Drawing Sheets

(51) Int. Cl.
  *C04B 35/547* (2006.01)
  *C04B 35/653* (2006.01)
  *C04B 35/626* (2006.01)
  *C04B 35/645* (2006.01)

(52) U.S. Cl.
  CPC .......... *C04B 35/645* (2013.01); *C04B 35/653* (2013.01); *H10N 10/17* (2023.02); *C04B 2235/446* (2013.01); *C04B 2235/5436* (2013.01); *C04B 2235/666* (2013.01); *C04B 2235/77* (2013.01); *C04B 2235/9607* (2013.01)

(58) Field of Classification Search
  CPC ...... C04B 2235/5436; C04B 2235/666; C04B 2235/77; C04B 2235/9607; C04B 35/547; C04B 35/6261; C04B 35/645; C04B 35/653
  See application file for complete search history.

(56) References Cited

U.S. PATENT DOCUMENTS

| | | | | |
|---|---|---|---|---|
| 2016/0035954 A1* | 2/2016 | Salvador | ................ | C22C 12/00 419/30 |
| 2020/0227609 A1* | 7/2020 | Tsurumi | .................. | H01L 35/26 |

FOREIGN PATENT DOCUMENTS

| | | | | |
|---|---|---|---|---|
| KR | 20180023765 A | 3/2018 | | |
| KR | 1020190009341 A | 1/2019 | | |
| KR | 20190012456 A | 2/2019 | | |
| WO | WO-2019039320 A1 * | 2/2019 | ............. | C01B 33/02 |

\* cited by examiner

>Micro structure (X500)<

Manufactured copper sheet-type thermoelectric element

PSEUDO-TERNARY THERMOELECTRIC MATERIAL, METHOD OF MANUFACTURING THE SAME, THERMOELECTRIC ELEMENT, AND THERMOELECTRIC MODULE

CROSS-REFERENCE TO RELATED APPLICATION(S)

This application claims the priority benefit of Korean Patent Application No. 10-2020-0022331 filed on Feb. 24, 2020, in the Korean Intellectual Property Office, the disclosure of which is incorporated herein by reference for all purposes.

BACKGROUND

1. Field

One or more example embodiments relate to a pseudo-ternary thermoelectric material, a method of manufacturing the pseudo-ternary thermoelectric material, a thermoelectric element, and a thermoelectric module.

2. Description of Related Art

A thermoelectric effect refers to a reversible direct conversion between heat energy and electric energy and is generated by a movement of electrons and holes in a material. The thermoelectric effect encompasses a Peltier effect which is applied to a cooling field using a temperature difference between both ends formed by a current applied from outside, and a Seebeck effect which is applied to a generation field using an electromotive force (EMF) generated from a temperature difference between both ends of a material.

A level of performance of a thermoelectric material may be referred to as a dimensionless thermoelectric figure of merit, or a ZT value, defined as represented by Equation 1 below.

$$ZT = \frac{S^2 \sigma T}{k} \quad \text{[Equation 1]}$$

In Equation 1 above, Z denotes a figure of merit. S denotes a Seebeck coefficient. σ denotes an electrical conductivity. T denotes an absolute temperature. κ denotes a thermal conductivity.

However, the electrical conductivity and the Seebeck coefficient have a trade-off relationship such that, when one of them increases, the other decreases. Thus, for approximately 50 years from the late 1950s to the early 2000s, the ZT value remained at approximately 1, which is a value of a bulk bismuth telluride ($Bi_2Te_3$)-based alloy, and was equivalent to merely about 10% of the efficiency of a Carnot engine. Thus, to increase the thermoelectric figure of merit, or the ZT value, as represented by Equation 1 above, there has been ongoing research on a method of increasing the Seebeck coefficient and the electrical conductivity, or a power factor ($S^2\sigma$), and decreasing the thermal conductivity.

A currently commercialized thermoelectric material is manufactured through a single-crystal method, such as, for example, zone melting, a Czochralski process, a Bridgman process, and the like, and the performance thereof hovers at ZT 0.7 to 0.8 levels. In addition, it may have a cleavage surface along a base surface and thus be easily cracked, and thus be ineffective in terms of durability of a thermoelectric module manufactured and commercialized using the thermoelectric material.

A bismuth telluride (BiTe) alloy is known as a thermoelectric material having an optimal level of performance in a temperature range from approximately 300 degrees Celsius (° C.) to 500° C. However, it has a low thermoelectric property at room temperature, and it is only used for limited applications.

For a thermoelectric module for thermoelectric generation, it is required to develop a thermoelectric material having a relatively high thermoelectric property in a wide temperature range because there may be an environment where the temperature of a heat source is not consistent but varying. In related arts, a single thermoelectric material may not be used in an environment where there are various heat sources or the temperature of a heat source varies, and various thermoelectric materials having optimal thermoelectric properties at different temperatures may be combined to be used. However, when such different materials are combined, the mechanical and thermal stability of a thermoelectric module may be degraded due to the diffusion of heterogeneous materials and a difference in thermal expansion coefficient, and thus the long-term stability of the thermoelectric module may be degraded.

SUMMARY

An aspect provides a pseudo-ternary thermoelectric material, a method of manufacturing the pseudo-ternary thermoelectric material, a thermoelectric element, and a thermoelectric module that may enable the achievement of a high-density and uniform Seebeck coefficient without hindering a movement of electrons, and enable the increase in production through the mass-production.

However, aspects or tasks to be achieved by the present disclosure are not limited to the aspect described in the foregoing, and thus other aspects or tasks not described above may also be clearly understood by those skilled in the art from the following description.

According to an example embodiment, there is provided a pseudo-ternary thermoelectric material including bismuth (Bi), antimony (Sb), tellurium (Te), and selenium (Se). A composition ratio of the pseudo-ternary thermoelectric material may be $Bi_xSb_{2-x}Te_3$ in which $0.3 \leq x \leq 0.6$, or $(Bi_2Te_3)_{1-x-y}(Sb_2Te_3)_x(Sb_2Se_3)_y$ in which $0 < x < 1$ and $0.001 \leq y \leq 0.05$.

A sintered density may be greater than or equal to 99%, and a density deviation may be 99.8±0.01%.

A difference in Seebeck coefficient between a center portion and an edge portion may be 2 millivolts per Kelvin (mV/K) to 4 mV/K.

A particle size in the center portion may be less than or equal to 6 micrometers (μm), and a particle size in the edge portion may be less than or equal to 10 μm. An average particle size in the center portion may be greater than an average particle size in the edge portion.

A degree of hardness of the center portion may be greater than or equal to 30 Vickers hardness (HV) and less than 50 HV, and a degree of hardness of the edge portion may be greater than or equal to 50 HV and less than or equal to 80 HV.

The pseudo-ternary thermoelectric material may be a p-type semiconductor.

The pseudo-ternary thermoelectric material may be large with a length of 50 millimeters (mm) to 70 mm, a thickness of 30T to 50T, and a weight of 1 kilogram (kg).

According to another example embodiment, there is provided a method of manufacturing a pseudo-ternary thermoelectric material, the method including melting bismuth (Bi), antimony (Sb), tellurium (Te), and selenium (Se), preparing an ingot by quenching a molten raw material obtained by the melting, preparing raw powder by pulverizing the ingot, and preparing a thermoelectric material specimen by performing spark plasma sintering (SPS) on the raw powder.

The melting of Bi, Sb, Te, and Se may include weighing such that a composition ratio is $Bi_xSb_{2-x}Te_3$ in which $0.3 \leq x \leq 0.6$, or $(Bi_2Te_3)_{1-x-y}(Sb_2Te_3)_x(Sb_2Se_3)_y$, in which $0 < x < 1$ and $0.001 \leq y \leq 0.05$.

The melting of Bi, Sb, Te, and Se may include melting Bi, Sb, Te, and Se in a temperature range between 650 degrees Celsius (° C.) and 750° C.

The preparing of the raw powder by pulverizing the ingot may be performed through one of blade milling, ball milling, attrition milling, gyro ball milling, and jet milling.

A powder size of the raw powder may be 0.1 μm to 50 μm.

The SPS may be performed for 10 minutes to 2 hours under a pressure of 10 megapascals (MPa) to 60 MPa and at a temperature of 200° C. to 500° C. in a vacuum atmosphere.

The thermoelectric material specimen may be cut in a direction perpendicular to a direction of the SPS.

According to still another example embodiment, there is provided a thermoelectric element including the pseudo-ternary thermoelectric material described above, or a pseudo-ternary thermoelectric material manufactured by the method described above.

According to yet another example embodiment, there is provided a thermoelectric module including a first electrode, a second electrode, and the thermoelectric element described above that is interposed between the first electrode and the second electrode.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the present disclosure will become apparent and more readily appreciated from the following description of example embodiments, taken in conjunction with the accompanying drawings of which:

FIG. 1 is a diagram illustrating a center portion and an edge portion of a pseudo-ternary thermoelectric material according to an example embodiment;

DETAILED DESCRIPTION

Figure 1:
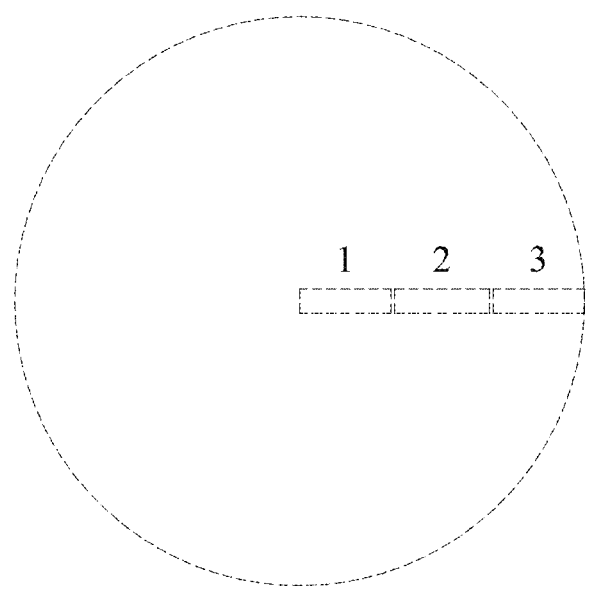
FIG. 1 illustrates scanning electron microscope (SEM) images of a magnetic print film formed using plate-type magnetic particles among various types of magnetic particles to observe a shape of such magnetic particles, and optical microscope (OM) images of the magnetic print film, and also illustrates a scattering principle and contrasts or shades in an actually embodied magnetic print film according to an example embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness. The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, operations, elements, and/or components, but do not preclude the presence or addition of one or more other features, integers, operations, elements, components, and/or groups thereof. In addition, terms such as first, second, A, B, (a), (b), and the like may be used herein to describe components. Each of these terminologies is not used to define an essence, order, or sequence of a corresponding component but used merely to distinguish the corresponding component from other component(s).

It should be noted that if it is described in the specification that one component is "connected," "coupled," or "joined" to another component, a third component may be "connected," "coupled," and "joined" between the first and second components, although the first component may be directly connected, coupled or joined to the second component. In addition, it should be noted that if it is described in the specification that one component is "on" another component, the two components may be in contact with each other, and also a third component may be present therebetween.

Unless otherwise defined, all terms, including technical and scientific terms, used herein have the same meaning as commonly understood by one of ordinary skill in the art to which this disclosure pertains based on an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

Hereinafter, example embodiments will be described in detail with reference to the accompanying drawings. Regarding the reference numerals assigned to the elements in the drawings, it should be noted that the same elements will be designated by the same reference numerals, wherever possible, even though they are shown in different drawings.

Hereinafter, a pseudo-ternary thermoelectric material, a method of manufacturing the pseudo-ternary thermoelectric material, a thermoelectric element, and a thermoelectric module will be described in detail with reference to examples and accompanying drawings. However, the present disclosure is not limited to the examples and accompanying drawings.

According to an example embodiment, a pseudo-ternary thermoelectric material includes bismuth (Bi), antimony (Sb), tellurium (Te) and selenium (Se). A composition ratio of the pseudo-ternary thermoelectric material may be $Bi_xSb_{2-x}Te_3$ $Bi_xSb_{2-x}Te_3$ in which $0.3 \leq x \leq 0.6$, or $(Bi_2Te_3)_{1-x-y}(Sb_2Te_3)_x(Sb_2Se_3)_y$, in which $0 < x < 1$ and $0.001 \leq y \leq 0.05$. When a BiSbTe-based material is used as the thermoelectric material, it may have a relatively great level of performance in a temperature range including a room temperature, and may be used to radiate heat of highly integrated elements, various sensors, or the like.

The pseudo-ternary thermoelectric material may have a sintered density of 99% or greater and have a density deviation of 99.8±0.01%. The pseudo-ternary thermoelectric material may be manufactured by a melting and alloying method, and it is possible to manufacture a high-density and uniform BiSbTe-based thermoelectric material.

FIG. 1 is a diagram illustrating a center portion and an edge portion of a pseudo-ternary thermoelectric material according to an example embodiment. Referring to FIG. 1, a pseudo-ternary thermoelectric material may be of a circular form, of which a portion corresponding to reference numeral 1 is a center portion and a circumferential portion corresponding to reference numeral 3 is an edge portion.

According to an example embodiment, the pseudo-ternary thermoelectric material may have a Seebeck coefficient difference between the center portion and the edge portion thereof, which may be 2 millivolts per Kelvin (mV/K) to 4 mV/K. Although a Seebeck coefficient of the edge portion may be greater than that of the center portion, a standard deviation may not be great, and it may be thus even or smooth as a whole.

A particle size in the center portion may be less than or equal to 6 micrometers (μm) and a particle size in the edge portion may be less than or equal to 10 μm. An average particle size in the center portion may be greater than an average particle size in the edge portion. Here, the smaller the particle size, the better. Currently, hundreds to tens nano-level thermoelectric powder may not be manufactured in large quantities, and only a few μm average particle size may be considered very fine powder.

A higher joule of heat may be generated at the center portion of the pseudo-ternary thermoelectric material, and grain growth may occur.

A degree of hardness of the center portion may be greater than or equal to 30 Vickers hardness (HV) and less than 50 HV, and a degree of hardness of the edge portion may be greater than or equal to 50 HV and less than or equal to 80 HV. A degree of hardness may gradually increase from the center portion to the edge portion.

The pseudo-ternary thermoelectric material may be a p-type semiconductor.

The pseudo-ternary thermoelectric material may be large in scale with a length of 50 millimeters (mm) to 70 mm, a thickness of 30T to 50T, and a weight of 1 kilogram (kg).

The pseudo-ternary thermoelectric material may be provided on a large scale without impurities or lattice defects, and have a single-phase, and high-density and uniform thermoelectric property.

According to another example embodiment, a method of manufacturing a pseudo-ternary thermoelectric material may include melting bismuth (Bi), antimony (Sb), tellurium (Te), and selenium (Se), preparing an ingot by quenching a molten raw material obtained by the melting, preparing raw powder by pulverizing the ingot, and preparing a thermoelectric material specimen by performing spark plasma sintering (SPS) on the raw powder.

Figure 2:
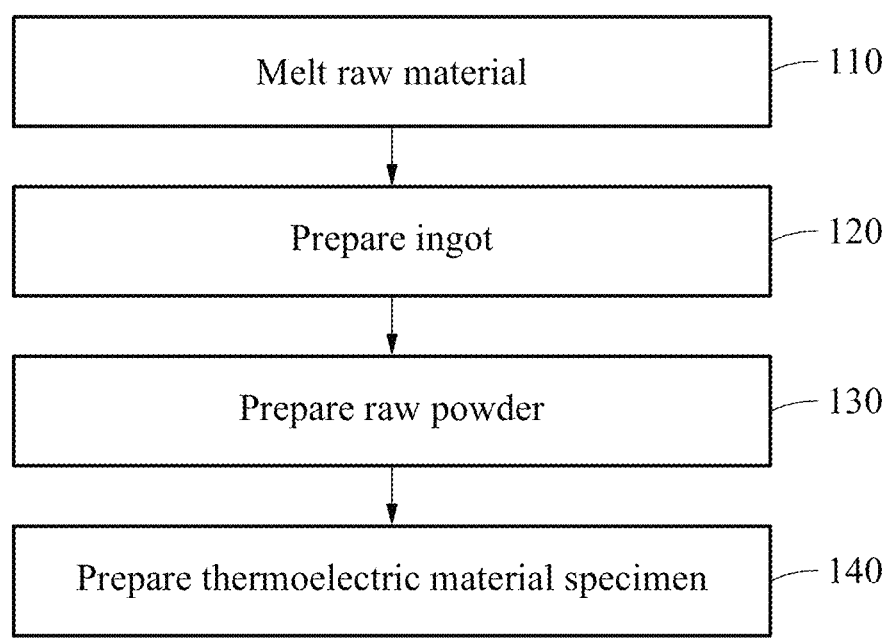
FIG. 2 is a flowchart illustrating a method of manufacturing a pseudo-ternary thermoelectric material according to an example embodiment.

FIG. 2 is a flowchart illustrating an example of a method of manufacturing a pseudo-ternary thermoelectric material according to an example embodiment. Referring to FIG. 2, a method of manufacturing a pseudo-ternary thermoelectric material includes operation 110 of melting a raw material, operation 120 of preparing an ingot, operation 130 of preparing raw powder, and operation 140 of preparing a thermoelectric material specimen.

The method of manufacturing the pseudo-ternary thermoelectric material may be performed through a melting and alloying method which may be effective in improving a thermal property.

Operation 110 may include melting bismuth (Bi), antimony (Sb), tellurium (Te), and selenium (Se).

The melting of bismuth (Bi), antimony (Sb), tellurium (Te), and selenium (Se) may include melting them by weighing such that a composition ratio is $Bi_xSb_{2-x}Te_3$ in which $0.3 \leq x \leq 0.6$, or $(Bi_2Te_3)_{1-x-y}(Sb_2Te_3)_x(Sb_2Se_3)_y$ in which $0 < x < 1$ and $0.001 \leq y \leq 0.05$.

A raw material of bismuth (Bi) may include at least one selected from a group consisting of, for example, Bi, $BiF_3$, $BiF_5$, $BiCl_3$, $BiBr_3$, $BiI_3$, $Bi_2O_3$, $Bi(OH)_3$, BiOCl, BiOI, $BiONO_3$, $Bi(NO_3)_3$, $Bi(NO_3)_3 \cdot xH_2O$ (x is a natural number), $BiPO_4$, and $(BiO)_2CO_3$. A raw material of antimony (Sb)

may include at least one selected from a group consisting of, for example, Sb, SbOCl, $SbCl_3$, $SbCl_5$, $Sb_2O_3$, $Sb_2O_5$, $Sb_2O_4$, $SbBr_3$, $SbF_3$, and $SbF_5$. A raw material of tellurium (Te) may include at least one selected from a group consisting of, for example, Te, $TeO_2$, $TeO_3$, $Te(OH)_6$, $Na_2TeO_3$, $K_2TeO_3$, $TeI_4$, $TeBr_4$, and $TeCl_4$.

For the melting of the raw material, there is no limit to a method. For example, the melting may be performed in a rocking furnace. In this example, it may be desirable to insert the weighted Pb, Te, and Bi into a vacuum ampoule, and then input and melt it in the rocking furnace.

The melting of bismuth (Bi), antimony (Sb), tellurium (Te), and selenium (Se) may be performed in a temperature range between 650 degrees Celsius (° C.) and 750° C. When the temperature for the melting is less than 650° C., the melting may not be performed evenly. In addition, when the temperature for the melting exceeds 750° C., a chemical composition amount may be inconsistent and a thermoelectric performance may be degraded, due to Te which is a volatile element.

Operation 120 may include preparing the ingot by quenching a molten raw material obtained by the melting.

Operation 130 may include preparing the raw powder by pulverizing the ingot. Here, the pulverizing may also include grinding or milling.

The preparing of the raw powder by pulverizing the ingot may be performed through one of blade milling, ball milling, attrition milling, gyro ball milling, and jet milling.

For the pulverizing, there is no limit to a method, and a general pulverizer may be used. The blade milling may be desirably used. Through the blade milling, coarse particles may be pulverized or milled by blades continuously until a sample passes through a separation screen disposed inside while the sample is moving along a flow of air by a blower. A portion of the sample that is not pulverized or milled may be captured or collected based on the transport of air. The pulverizing or milling may be performed in an inert state with oxygen being less than or equal to 0.10%.

A powder size of the raw powder may be 0.1 μm to 50 μm. The smaller the size of the raw powder, the better. Currently, hundreds to tens nano-level thermoelectric powder may not be manufactured in large quantities, and only a few μm average particle size may be considered very fine powder.

Operation 140 may include manufacturing a bar-shaped thermoelectric material specimen having a certain diameter and height by performing SPS on the raw powder. In addition, it is possible to manufacture a thermoelectric material pellet of a predetermined size by cutting the bar-shaped thermoelectric material specimen in a direction perpendicular to a direction of the SPS using an electric spark machine. Through the SPS, it is possible to obtain a robust sintered body of a thermoelectric material with little or least microcracks.

The SPS may be performed for 10 minutes to 2 hours, or desirably 10 to 30 minutes, under a pressure of 10 megapascals (MPa) to 100 MPa, or desirably 10 MPa to 60 MPa, and at a temperature of 200° C. to 500° C., or desirably 300° C. to 420° C., in a vacuum atmosphere. At a temperature less than 200° C., physical thermoelectric performance including, for example, a density and hardness of the sintered body may be degraded. At a temperature exceeding 500° C., a stable phase may not be obtained due to the volatilization of Te. In addition, under a pressure less than 10 MPa, a desired phase may not be obtained. Under a pressure exceeding 100 MPa, there may be no significant change in the property.

Here, 10 minutes may be a minimum amount of time for sintering. However, the time exceeding 2 hours may not change the property.

Only when a temperature and a pressure for the SPS are greater than or equal to predetermined conditions, a high-purity thermoelectric material may be formed to have improved thermoelectric properties. However, under other conditions, a very small amount of components of the thermoelectric material may remain in a structure at the time of the manufacturing, which may hinder charge transfer and increase electric resistivity. Thus, when the temperature and pressure do not satisfy the predetermined conditions, the electric resistivity may increase and the thermoelectric property may thus be degraded. In addition, at a high temperature, a component of the thermoelectric material may be volatilized, and thus the thermoelectric property may change greatly according to a degree of volatilization of the component when it is repeatedly exposed to a thermal environment.

Through such an SPS, and an annealing process as needed, it is possible to induce an interfacial reaction between nanoparticles and the thermoelectric material. When a previous state is maintained before the reaction is completed, a nanocomposite phase formed by the reaction and nanoparticles that are not reacted may coexist, and thus a density may increase. Here, the newly generated interface may act as a scattering center that induces phonons (mainly mid/long-wavelength phonons) to be scattered, along with a surface of the nanoparticles. Thus, an additional reduction in lattice thermal conductivity may be expected.

The method of manufacturing the pseudo-ternary thermoelectric material may reduce the energy used to manufacture a thermoelectric element and reduce a production cost. Thus, the method may enable the mass-production of a large pseudo-ternary thermoelectric material.

According to still another example embodiment, a thermoelectric element may include a pseudo-ternary thermoelectric material according to an example embodiment, or a pseudo-ternary thermoelectric material manufactured by a method of manufacturing a pseudo-ternary thermoelectric material according to another example embodiment.

The thermoelectric element may be obtained by molding the pseudo-ternary thermoelectric material through a method such as, for example, a cutting process. For example, when the pseudo-ternary thermoelectric material has a single-crystal structure, a cutting direction for the pseudo-ternary thermoelectric material may be, for example, a direction perpendicular to a growth direction.

The thermoelectric element may be a p-type thermoelectric element. Such a thermoelectric element may be provided in a predetermined shape, for example, a rectangular parallelepiped. In addition, the thermoelectric element may be combined with an electrode, and exhibit a cooling effect by a current applied and exhibit a power generation effect by a device or a temperature difference.

According to yet another example embodiment, a thermoelectric module may include a first electrode, a second electrode, and a thermoelectric element interposed between the first electrode and the second electrode.

Figure 3:
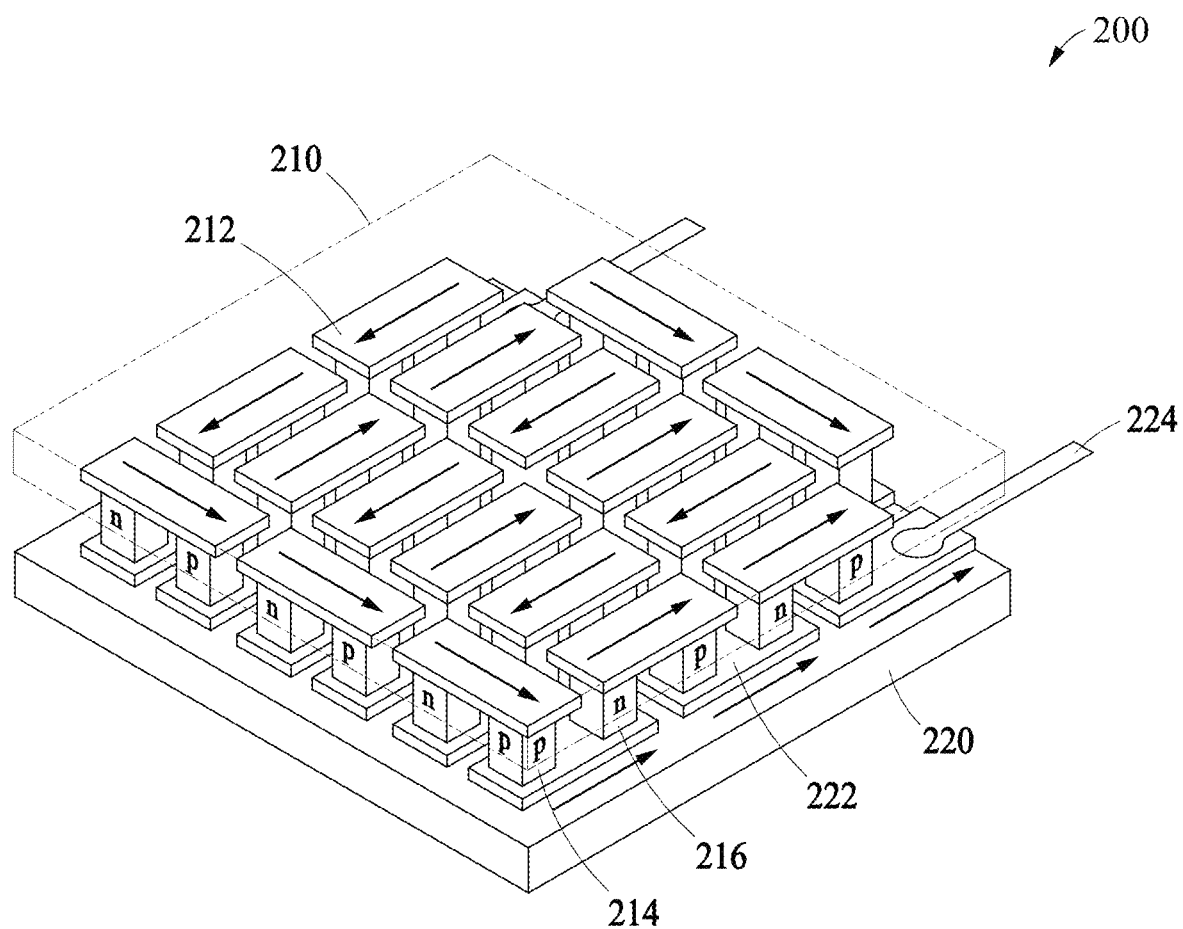
FIG. 3 is a diagram illustrating a thermoelectric module including a thermoelectric element according to an example embodiment.

FIG. 3 is a diagram illustrating a thermoelectric module 200 including a thermoelectric element according to an example embodiment. Referring to FIG. 3, the thermoelectric module 200 includes an upper insulator 210 and a lower insulator 220, and an upper electrode 212 and a lower electrode 222 that are patterned on the upper insulator 210 and the lower insulator 220, respectively. In addition, the thermoelectric module 200 includes a p-type thermoelectric component 214 and an n-type thermoelectric component 216 that contact the upper electrode 212 and the lower electrode 222. The electrodes 212 and 222 may be connected to an outside of the thermoelectric element through a lead electrode 224.

The insulators 210 and 220 may include at least one selected from a group consisting of, for example, gallium arsenide (GaAs), sapphire, silicon, pyrex, and quartz substrate. A material of the electrodes 212 and 222 may include at least one selected from a group consisting of aluminum, nickel, gold, and titanium. In addition, sizes thereof may be selected in various ways. For patterning the electrodes 212 and 222, any patterning method that is already known in related application fields may be used without a restriction. The patterning method may include at least one selected from a group consisting of a lift-off semiconductor process, a deposition method, and a photolithography.

According to an example, a p-type thermoelectric element and an n-type thermoelectric element may be alternately arranged, and at least one of the p-type thermoelectric element or the n-type thermoelectric element may include a thermoelectric material according to an example embodiment.

The thermoelectric module 200 may be a thermoelectric cooling system and a thermoelectric generation system, for example. The thermoelectric cooling system may include, for example, a micro cooling system, a general-purpose cooling device, an air conditioner, a waste heat generation system, or the like.

The example embodiments described herein will be described in greater detail with reference to examples below. However, they are not limited to the following examples.

EXAMPLES

In the following examples, thermoelectric material specimens having different values of x and y in a composition ratio of $(Bi_2Te_3)_{1-x-y}(Sb_2Te_3)_x(Sb_2Se_3)_y$, (x=0.76-0.79 and y=0.03) were prepared.

Example 1

A thermoelectric material specimen was prepared using a Bi—Te based alloy as a raw thermoelectric material and a melting and alloying method. To prepare the Bi—Te based alloy, powder of each of raw materials Bi, Sb, and Te was weighed to be at a mole ratio (x=0.79 and y=0.03) of the composition ratio $(Bi_2Te_3)_{1-x-y}(Sb_2Te_3)_x(Sb_2Se_3)_y$, and then inserted into a vacuum quartz tube and an argon (Ar) gas was injected. Subsequently, the quartz tube was inserted into a rocking or shaking furnace to melt the raw powder. Here, the melting was performed at a melting temperature of 960° C. for 10 hours.

An ingot was formed by taking out the melted raw powder from the rocking furnace, and then rapidly cooling it in air.

The ingot was milled and pulverized in an inert state with oxygen being less than or equal to 0.1% using a blade mill such that a powder size of the ingot is less than or equal to 45 μm. The blade mill may pulverize again coarse particles by blades continuously until a sample passes through a separation screen inside while the sample is being transported through a flow of air by a blower. Here, an unpulverized sample was captured or collected as the air flows.

The pulverized powder was prepared as a bar-type specimen using SPS. Here, conditions for the SPS included an atmosphere of a vacuum of $10^{-2}$ to $10^{-5}$ torr, a pressure of 30 to 60 MPa, a temperature of 250 to 400° C., and 30 minutes.

The prepared bar-type specimen was cut in a direction perpendicular to a direction of the SPS to have a coin shape having a diameter of 50 mm and a thickness of 37T.

Through the process described above, a specimen $(Bi_2Te_3)_{0.18}(Sb_2Te_3)_{0.79}(Sb_2Se_3)_{0.03}$ was prepared.

Example 2

A specimen $(Bi_2Te_3)_{0.2}(Sb_2Te_3)_{0.77}(Sb_2Se_3)_{0.03}$ was prepared through the same process as Example 1, except that the raw powder of each of Pb, Bi, and Te was weighed to have certain x and y values (x=0.77 and y=0.03) of the ratio $(Bi_2Te_3)_{1-x-y}(Sb_2Te_3)_x(Sb_2Se_3)_y$.

Example 3

A specimen $(Bi_2Te_3)_{0.21}(Sb_2Te_3)_{0.76}(Sb_2Se_3)_{0.03}$ was prepared through the same process as Example 1, except that the raw powder of each of Pb, Bi, and Te was weighed to have certain x and y values (x=0.76 and y=0.03) of the ratio $(Bi_2Te_3)_{1-x-y}(Sb_2Te_3)_x(Sb_2Se_3)_y$.

Figure 4:
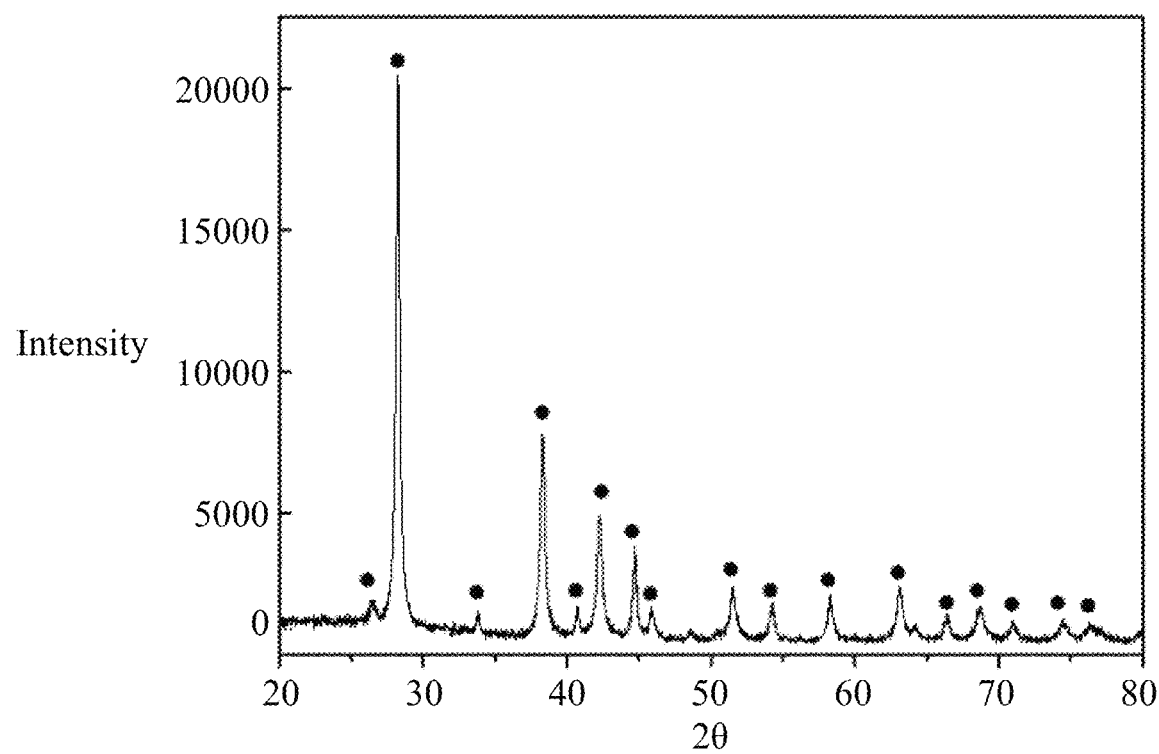
FIG. 4 is an X-ray diffraction (XRD) graph of powder used to prepare specimens of Examples 1 through 3 according to an example embodiment.

FIG. 4 is an X-ray diffraction (XRD) graph of powder used to prepare specimens of Examples 1 through 3 according to an example embodiment. Referring to FIG. 4, it was verified as an XRD pattern test result that the specimens of three compositions have a BiSbTe phase after the melting and alloying method. It was also verified as an XRD analysis result that there were no impurities or lattice defects, and there was a single phase.

Figure 5:
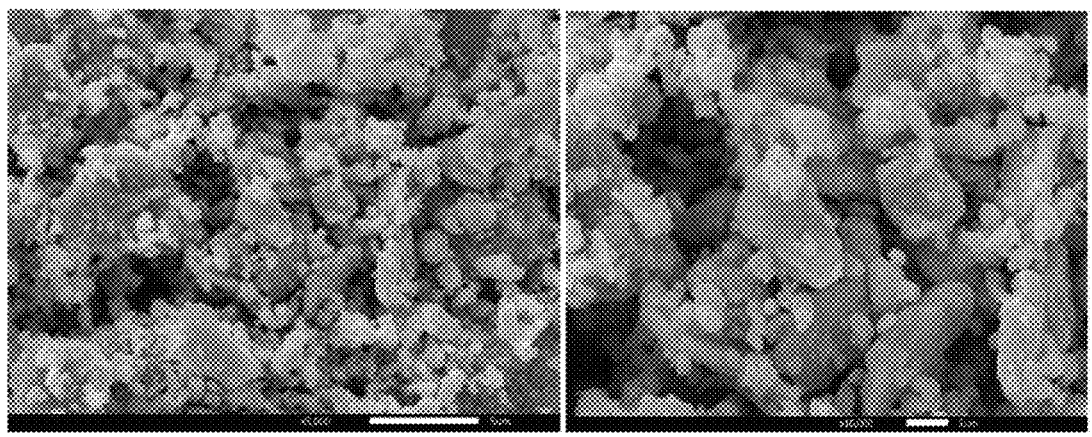
FIG. 5 is a scanning electron microscope (SEM) image of powder of Example 1.

FIG. 5 is a scanning electron microscope (SEM) image of powder of Example 1.

Referring to FIG. 5, it was verified that the shape of powder differs slightly and is irregular, and some powder is agglomerated.

Table 1 below indicates results of measuring amounts of oxygen of powder of Example 1.

TABLE 1

| Oxygen Analysis | Measured values (ppm) |
| --- | --- |
| 1 | 630.1 |
| 2 | 768.3 |
| 3 | 732.4 |
| 4 | 678.4 |
| 5 | 674.2 |
| 6 | 713.5 |
| 7 | 680.1 |
| Average | 696.7 |

It was verified that a result of measuring an amount of oxygen of powder is 0.07%.

Figure 6:
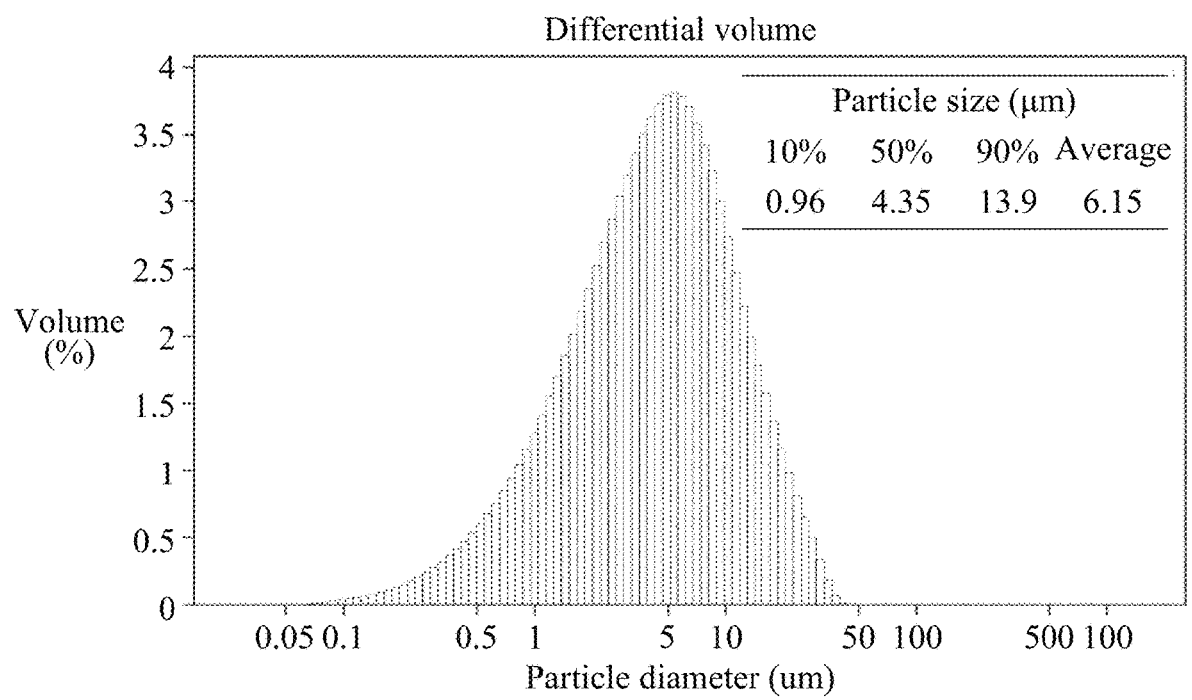
FIG. 6 is a graph illustrating a result of a particle size analysis of powder of Example 1.

FIG. 6 is a graph illustrating a result of a particle size analysis of powder of Example 1. Referring to FIG. 6, it was verified as a result of analyzing a particle diameter size of powder that an average particle size is approximately 6 μm.

Figure 7:
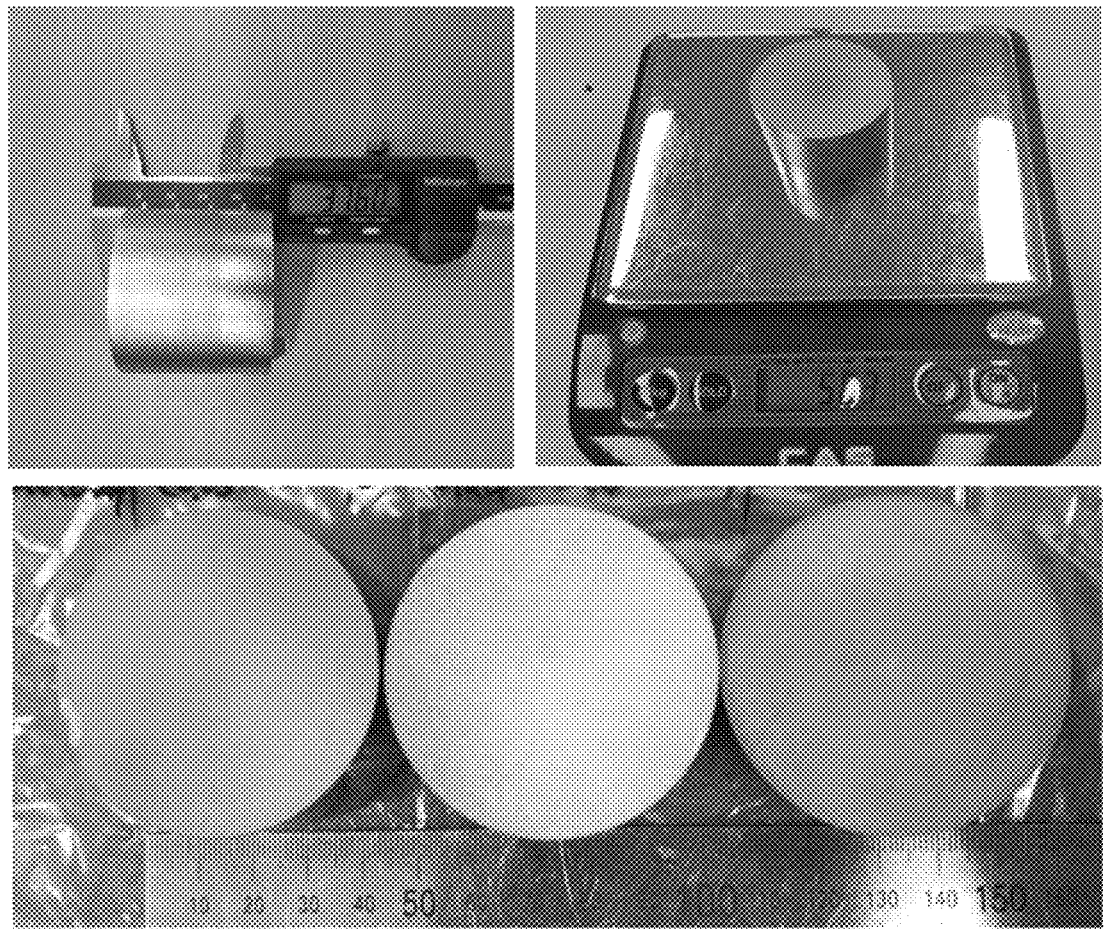
FIG. 7 is an image of a specimen of Example 1.

FIG. 7 is an image of a specimen of Example 1. The specimen of Example 1 is a sintered thermoelectric material with 50 mm and 37T.

Figure 8:
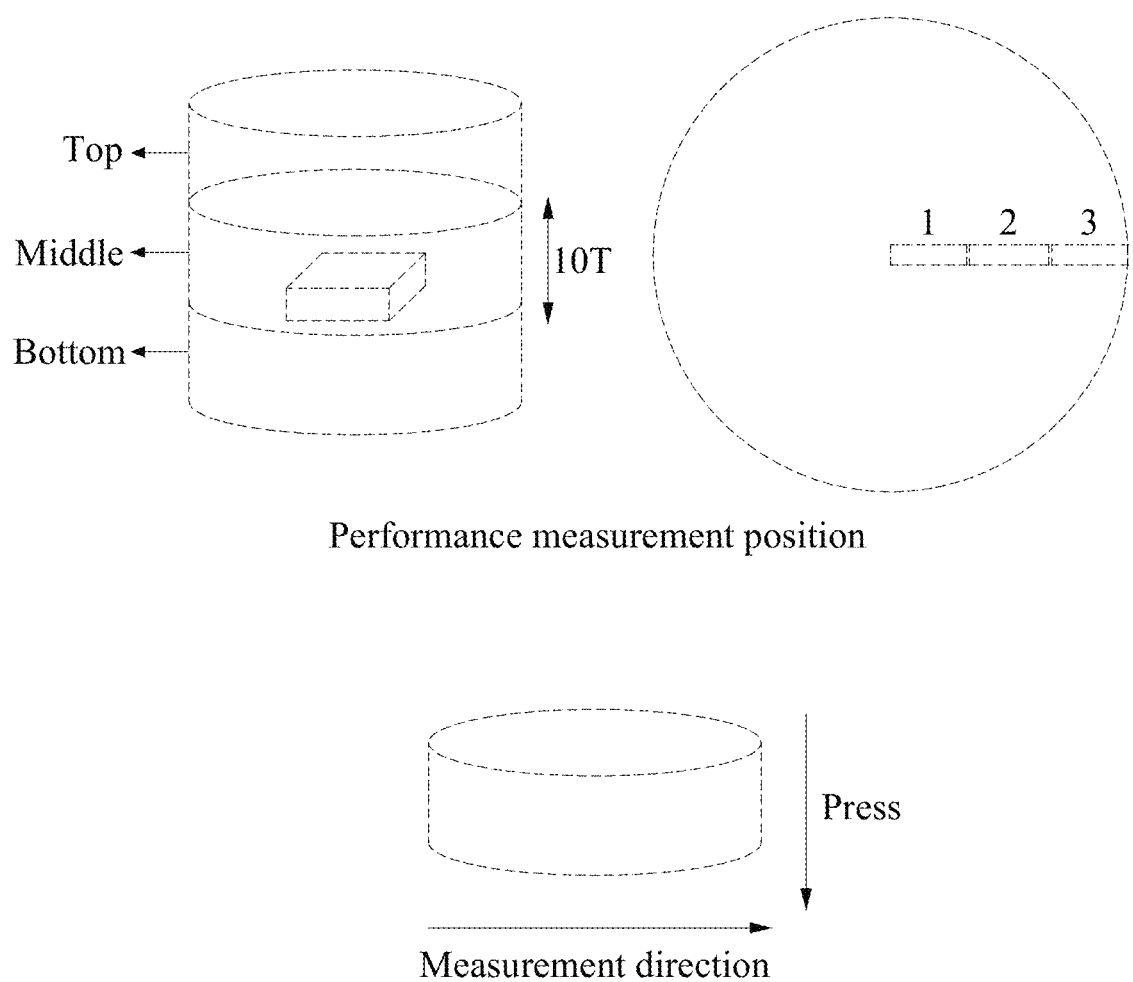
FIG. 8 is a diagram illustrating a performance measurement position and direction in which performance is measured for each composition of each of specimens of Examples 1 through 3.
Figure 9A:
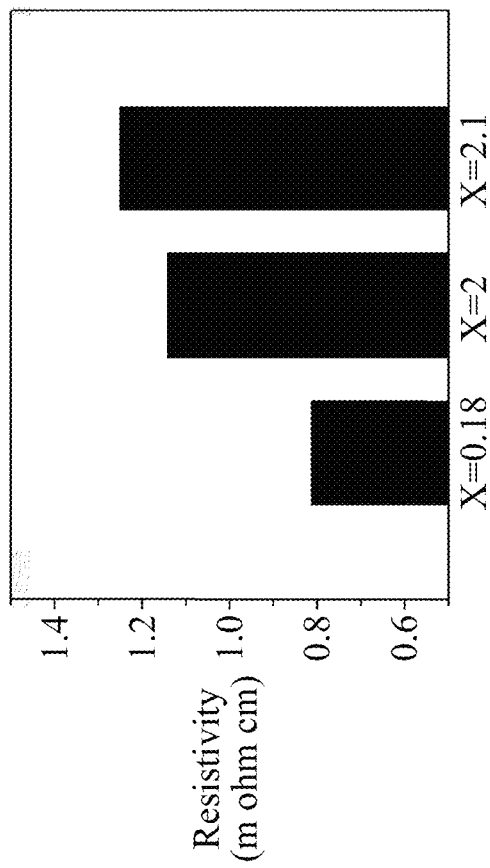
FIGS. 9A through 9D are graphs obtained by measuring performance for each composition of each of specimens of Examples 1 through 3.
Figure 9B:
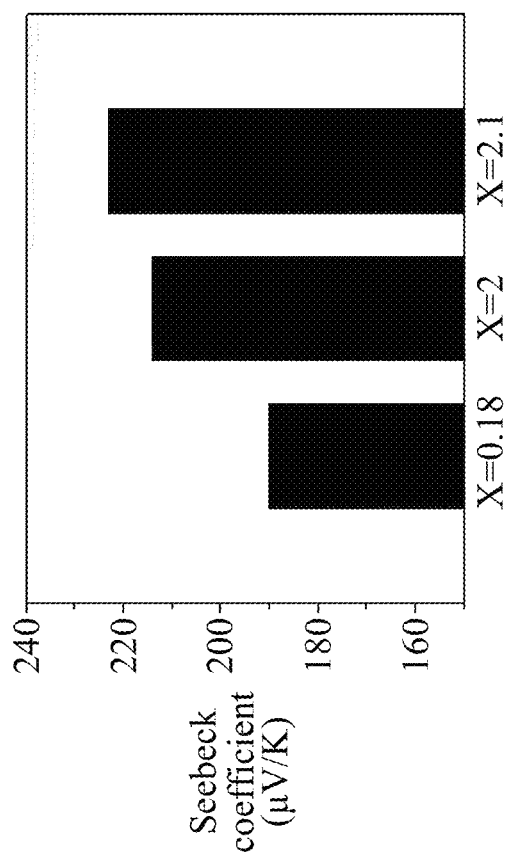
Figure 9C:
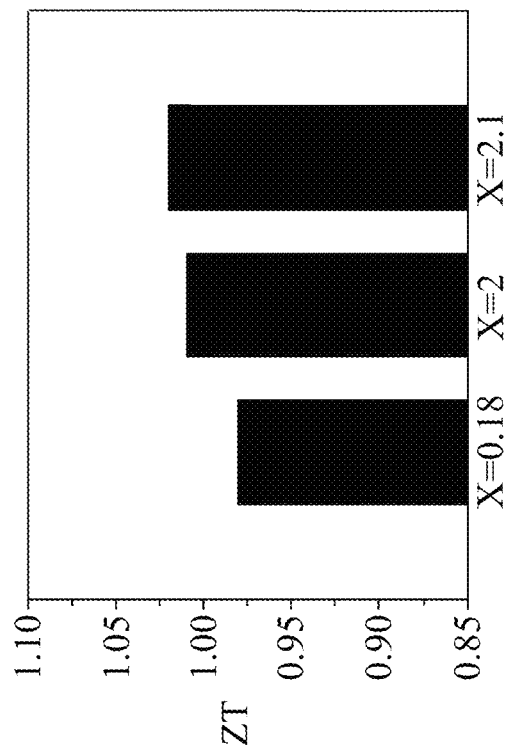
Figure 9D:
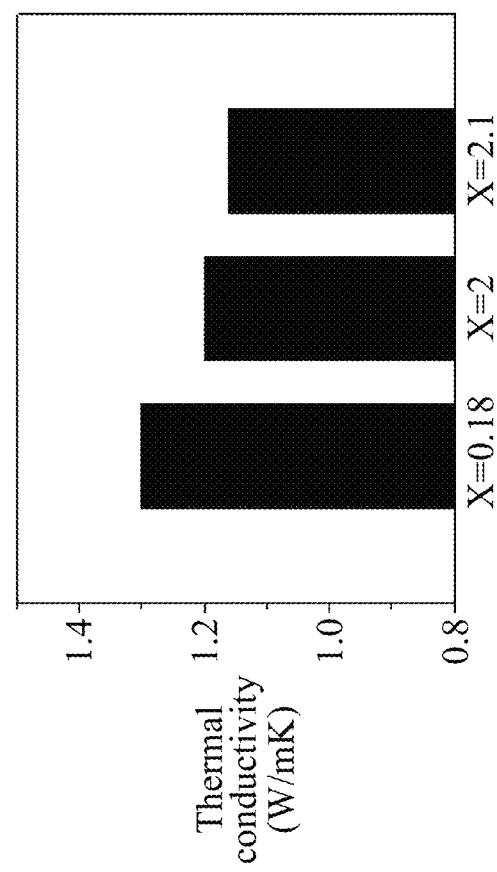

FIG. 8 is a diagram illustrating a performance measurement position and direction in which performance is measured for each composition of each of specimens of Examples 1 through 3.

FIGS. 9A through 9D are graphs obtained by measuring performance for each composition of each of specimens of Examples 1 through 3. Referring to FIGS. 9A through 9D, it was verified that, as an Sb content increases, Seebeck coefficient and resistivity decrease. It was also verified that ZT is 0.98 to 1.02, and a relative density for each composition is greater than or equal to 99%.

Figure 10A:
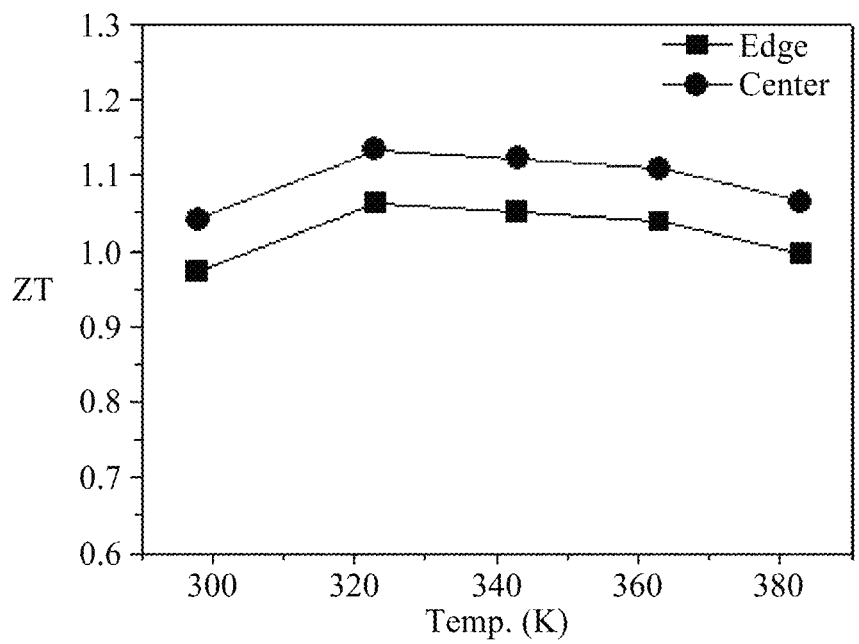
FIGS. 10A and 10B are graphs of results obtained by measuring Seebeck coefficients of a currently commercialized sample and a specimen of Example 1 based on a temperature.
Figure 10B:
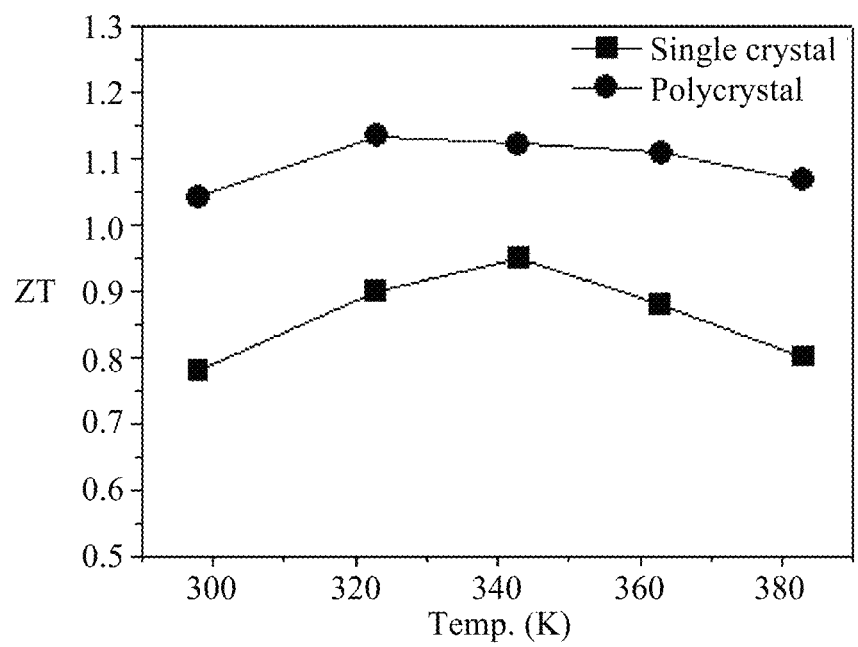

FIGS. 10A and 10B are graphs of results obtained by measuring Seebeck coefficients of a currently commercialized sample and a specimen of Example 1 based on a temperature. It was verified that there is 6% to 7% difference in performance between a center portion and an edge portion of a 500 g sample. It was verified that a mass-produced polycrystal material of the specimen of Example 1 has performance improved by approximately 20% to 25% compared to an existing single-crystal thermoelectric material.

Figure 11:
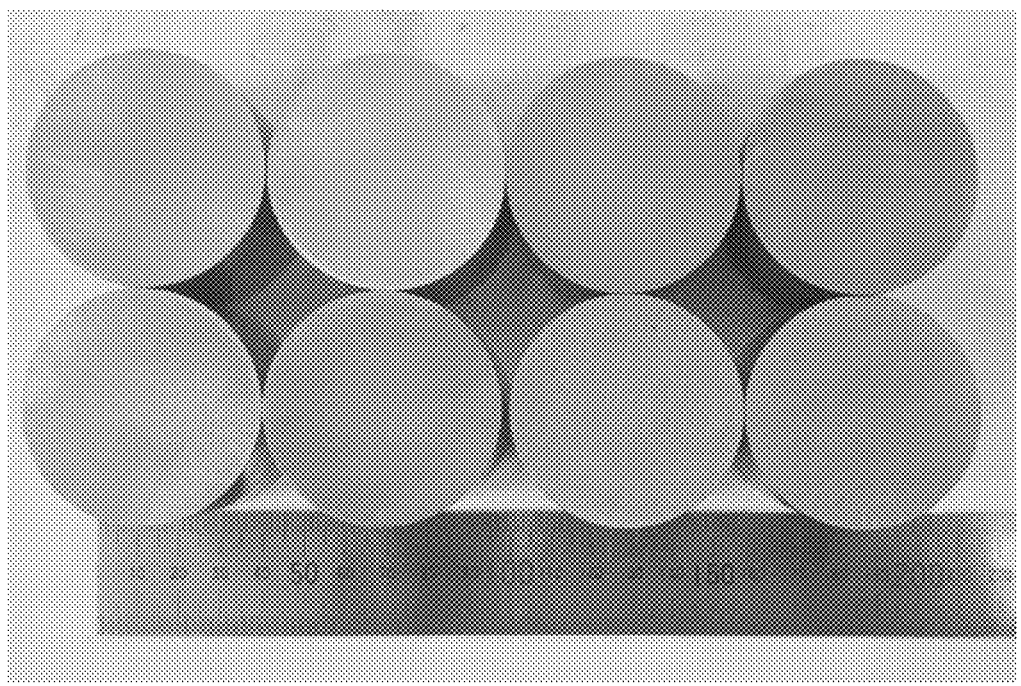
FIG. 11 is an image captured to verify densities of specimens according to an example embodiment.

FIG. 11 is an image captured to verify densities of specimens according to an example embodiment. Table 2 below indicates densities of samples of the specimens.

TABLE 2

|  | #1 | #2 | #3 | #4 | #5 | #6 | #7 | #8 | Average | Standard deviation |
|---|---|---|---|---|---|---|---|---|---|---|
| $Bi_{0.4}Sb_{1.6}Te_3$ sintered density (%) | 99.9 | 99.9 | 99.7 | 99.7 | 99.8 | 99.7 | 99.7 | 99.9 | 99.8 | 0.01 |

Referring to FIG. 11 and Table 2, a high-density and uniform Bi—Te based thermoelectric material was manufactured. A sintered density was 99% or higher, a density deviation was 99.8±0.01%, and a thermoelectric property was ZT: 1(RT).

Figure 12:
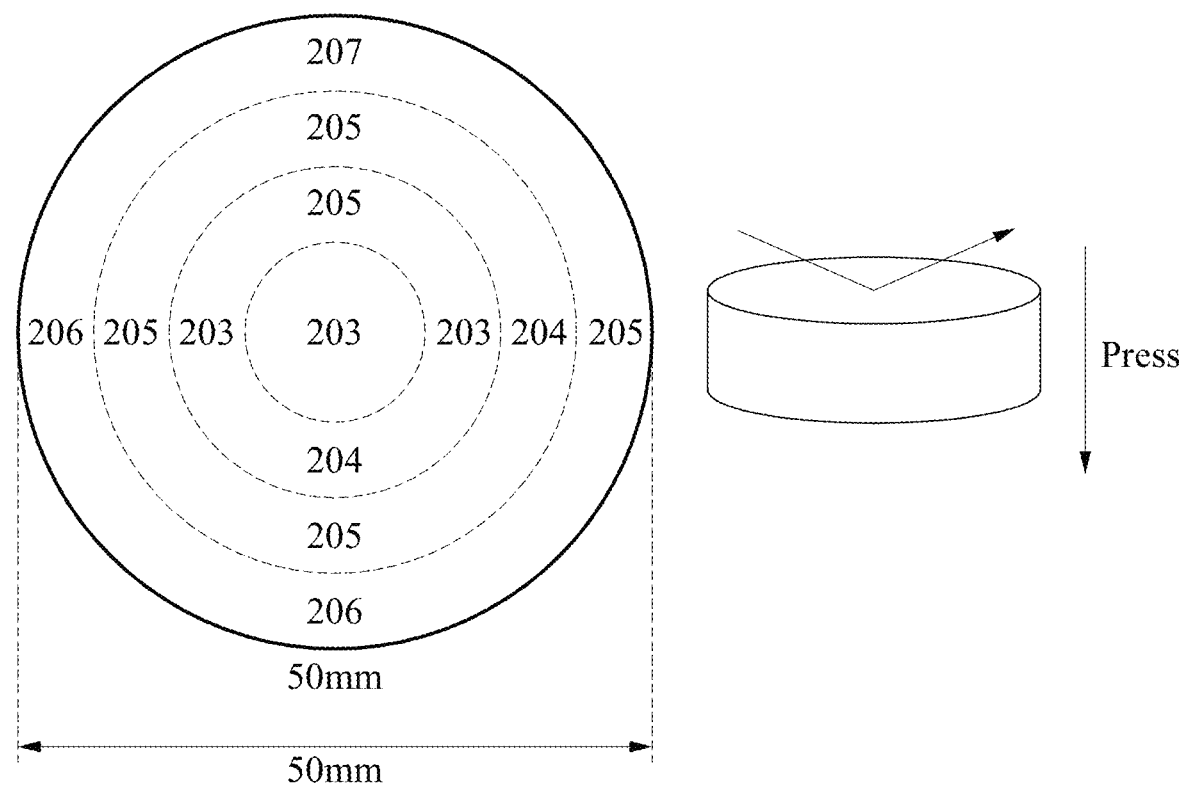
FIG. 12 is a diagram illustrating a Seebeck coefficient of each portion of a specimen according to an example embodiment.

FIG. 12 is a diagram illustrating a Seebeck coefficient of each portion of a specimen according to an example embodiment. Table 3 below indicates a result of measuring a Seebeck coefficient of each portion of a specimen. The Seebeck coefficient was measured using a potential-Seebeck microprobe.

TABLE 3

|  | #1 | #2 | #3 | #4 | #5 | #6 | #7 | #8 | Average | Standard deviation | Air (K) |
|---|---|---|---|---|---|---|---|---|---|---|---|
| $Bi_{0.4}Sb_{1.6}Te_3$ Seebeck coefficient (mV/k) | 208 | 203 | 205 | 204 | 205 | 205 | 206 | 204 | 205 | 1.4 | 300 |

Referring to FIG. 12 and Table 3, it was verified as a result of measuring a Seebeck coefficient of each portion that a difference in Seebeck coefficient between a center portion and an edge portion is approximately 3 to 4 mV/k.

Figure 13:
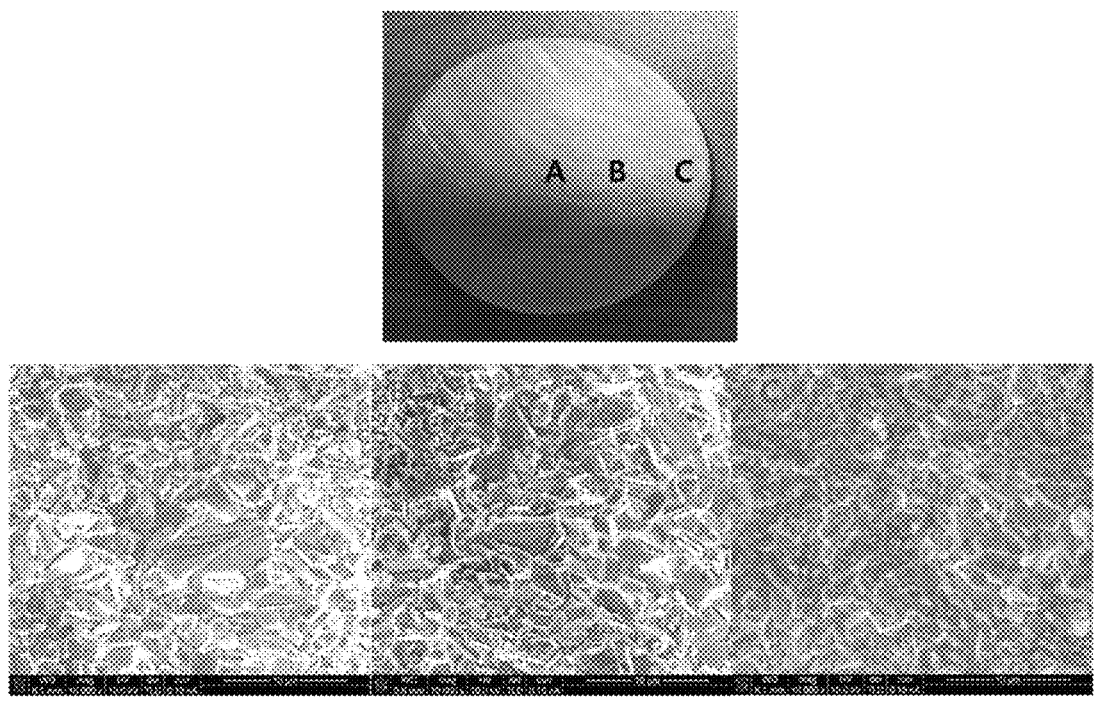
FIG. 13 is an image and an SEM image of a fine structure of each portion of a specimen of Example 1.

FIG. 13 is an image and an SEM image of a fine structure of each portion of a specimen of Example 1. Referring to FIG. 13, it was verified as a result of observing a fractured surface that an edge portion of a sintered body has a finer particle size compared to a center portion of the sintered body. It is thus considered that a higher joule of heat is generated at a center of a specimen due to a differenced in current density distribution, and thus grain growth occurs.

Figure 14A:
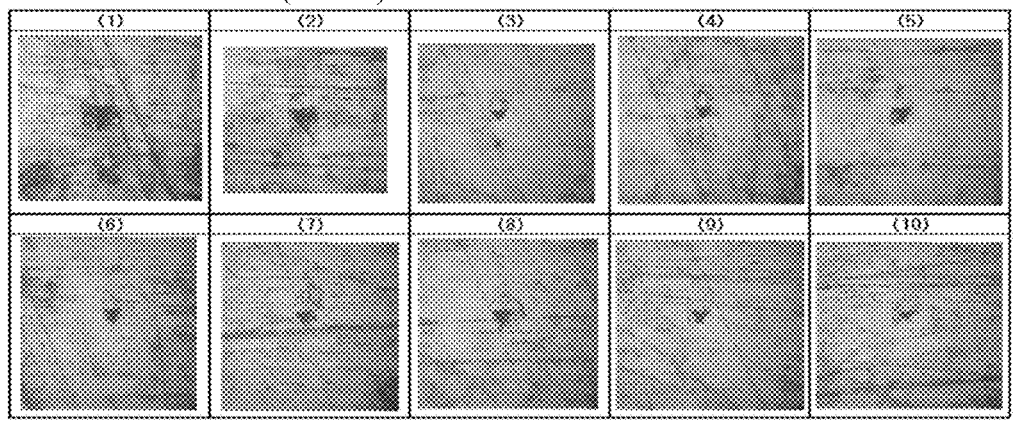
FIGS. 14A and 14B are a structure image and a graph showing a hardness distribution for each portion of a specimen of Example 1.
Figure 14B:
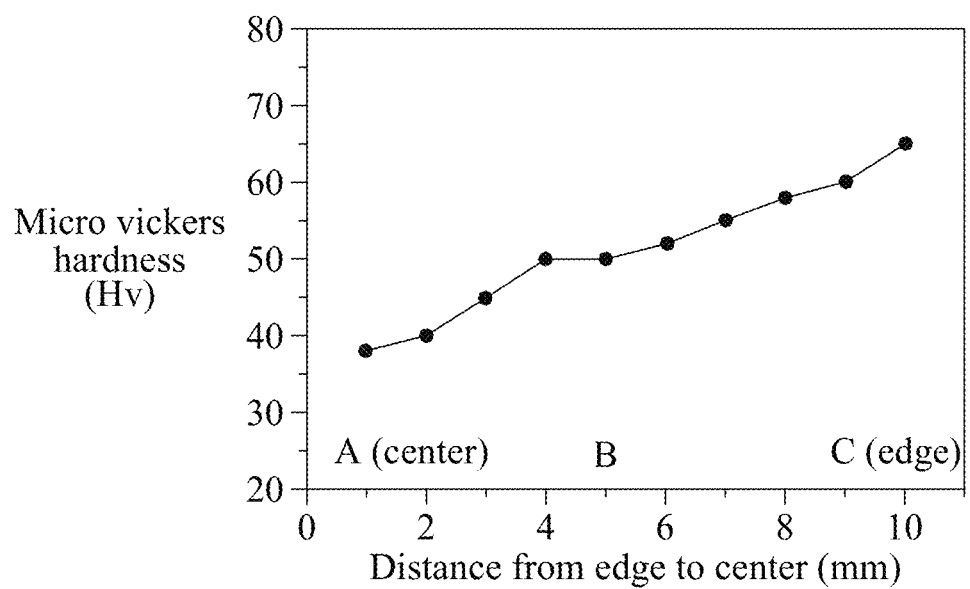

FIGS. 14A and 14B are a structure image and a graph showing a hardness distribution for each portion of a specimen of Example 1. Referring to FIGS. 14A and 14B, it was verified as a result of a Micro Vickers hardness test that a center portion of a sintered body has a lowest Vickers hardness (HV) value which is 38, and an edge portion of the sintered body has a highest HV value which is 64. That is, it was verified that a degree of hardness increases gradually from the center portion of the sintered body to the edge portion of the sintered body. It is thus considered that this is due to a difference in fine structure based on a position of a molded body.

Figure 15:
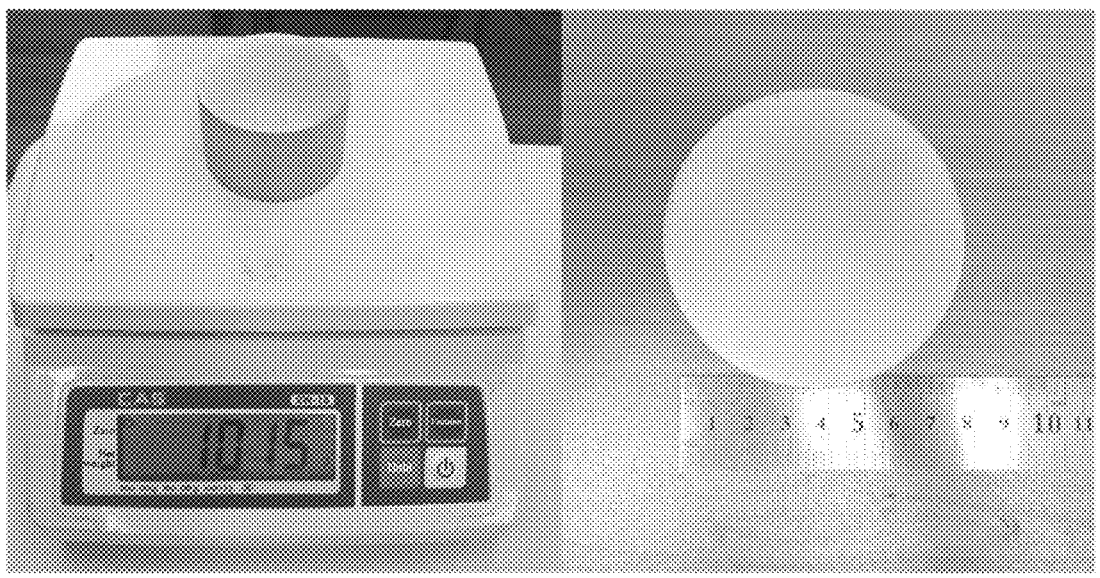
FIG. 15 is an image of a large sintered specimen according to an example embodiment.

FIG. 15 is an image of a large sintered specimen according to an example embodiment. It is possible to mass-produce a large specimen with 70 mm, 47T, and 1 kg, to improve the production by employing a method of manufacturing a pseudo-ternary thermoelectric material according to an example embodiment.

Leg Production Verification

A leg production was verified by slicing-plating-dicing a polycrystal material of 4 kg (production per day).

Figure 16:
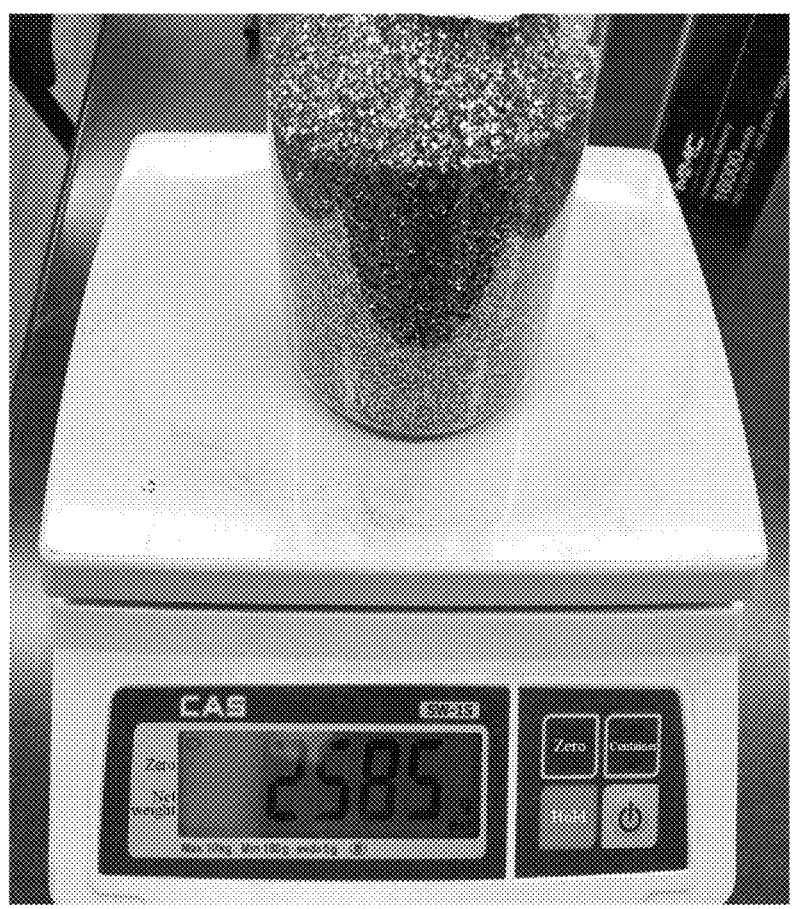
FIG. 16 is an image showing a weight measured after a leg production using a polycrystal material according to an example embodiment.

FIG. 16 is an image showing a weight measured after a leg production using a polycrystal material according to an example embodiment. It was verified that a leg production is approximately 65%.

Manufacturing a Thermoelectric Device

A 40×40 thin copper sheet-type thermoelectric device (Tesbi metal substrate applied) for a vehicle was produced by applying a developed polycrystal p-type thermoelectric material and a single-crystal n-type material.

Figure 17:
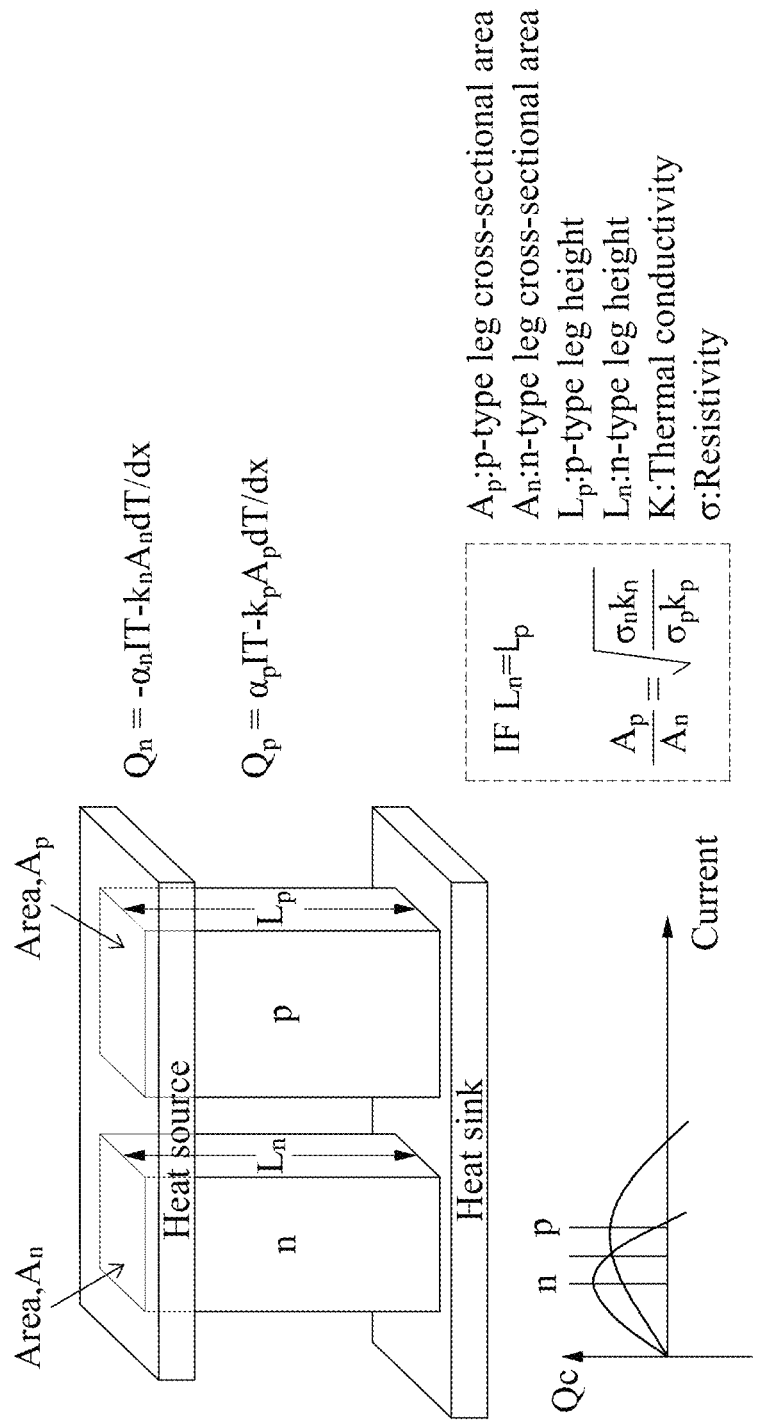
FIG. 17 is a design diagram illustrating a thermoelectric device according to an example embodiment.

FIG. 17 is a design diagram illustrating a thermoelectric device according to an example embodiment. A new thermoelectric device was manufactured through resistivity and thermal conductivity matching (optimization) as designed as illustrated in FIG. 17.

Figure 18:
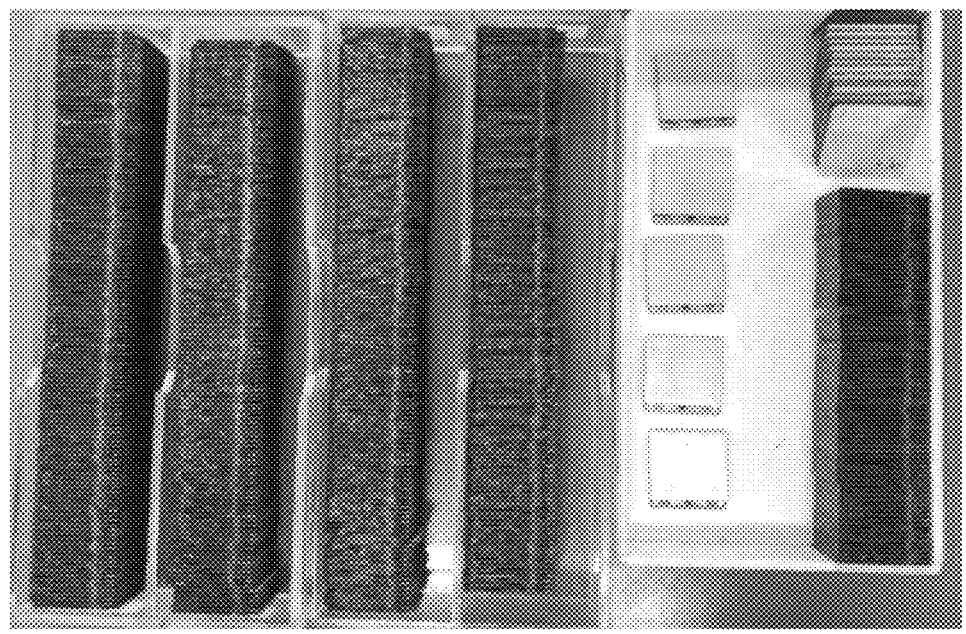
FIG. 18 is an image of a thin copper sheet-type thermoelectric element according to an example embodiment.

FIG. 18 is an image of a thin copper sheet-type thermoelectric element according to an example embodiment. Table 4 below indicates resistivity and dimensionless performance indices.

TABLE 4

|  | New | | Existing mass-production | |
|---|---|---|---|---|
| # | R [W] | Z (1/1000) | R [W] | Z (1/1000) |
| 1 | 3.52 | 2.25 | 3.54 | 2.06 |
| 2 | 3.52 | 2.29 | 3.50 | 2.05 |
| 3 | 3.53 | 2.26 | 3.54 | 2.03 |
| 4 | 3.53 | 2.28 | 3.53 | 2.08 |
| 5 | 3.54 | 2.31 | 3.49 | 2.03 |
| 6 | 3.56 | 2.35 | 3.53 | 2.08 |
| 7 | 3.52 | 2.35 | 3.54 | 2.03 |

TABLE 4-continued

| | New | | Existing mass-production | |
|---|---|---|---|---|
| # | R [W] | Z (1/1000) | R [W] | Z (1/1000) |
| 8 | 3.53 | 2.33 | 3.55 | 2.04 |
| 9 | 3.53 | 2.33 | 3.51 | 2.01 |
| 10 | 3.52 | 2.31 | 3.53 | 2.07 |
| 11 | 3.53 | 2.29 | 3.52 | 2.03 |
| 12 | 3.55 | 2.26 | 3.57 | 2.00 |
| 13 | 3.47 | 2.26 | 3.56 | 2.04 |
| 14 | 3.55 | 2.27 | 3.51 | 2.09 |
| 15 | 3.55 | 2.30 | 3.52 | 2.07 |
| Average | 3.53 | 2.3 | 3.53 | 2.05 |

Referring to FIG. 18 and Table 4 above, it was verified that a dimensionless performance index of a thermoelectric module increases, from 2.05 of Z (Z=2.05) approximately by 12% to 2.3 of Z, compared to existing mass-production.

According to an example embodiment described herein, it is possible to provide a large-scale pseudo-ternary thermoelectric material without impurities or lattice defects, and having a single-phase, and a high-density and uniform thermoelectric property.

According to an example embodiment described herein, it is possible to reduce energy and a production cost to be used to manufacture a thermoelectric element, and mass-produce a large pseudo-ternary thermoelectric material, by employing a method of manufacturing a pseudo-ternary thermoelectric material described herein.

According to an example embodiment described herein, it is possible to manufacture a thermoelectric element and a thermoelectric module using a pseudo-ternary thermoelectric material described herein.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A pseudo-ternary thermoelectric material comprising:
bismuth (Bi);
antimony (Sb);
tellurium (Te); and
selenium (Se),
wherein a composition ratio of the pseudo-ternary thermoelectric material is $Bi_xSb_{2-x}Te_3$ in which $0.3 \leq x \leq 0.6$, or $(Bi_2Te_3)_{1-x-y}(Sb_2Te_3)_x(Sb_2Se_3)_y$ in which $0<x<1$ and $0.001 \leq y \leq 0.05$,
wherein a particle size in a center portion is less than or equal to 6 micrometers (μm) and a particle size in an edge portion is less than or equal to 10 μm, and
an average particle size in the center portion is greater than an average particle size in the edge portion, and
wherein a difference in Seebeck coefficient between a center portion and an edge portion is 2 millivolts per Kelvin (mV/K) to 4 mV/K; and wherein said pseudo-ternary thermoelectric material is made by a process, comprising:
melting bismuth (Bi), antimony (Sb), tellurium (Te), and selenium (Se);
preparing an ingot by quenching a molten raw material obtained by the melting;
preparing raw powder with a size of 0.1 μm to 50 μm by pulverizing the ingot; and
preparing a thermoelectric material specimen by performing spark plasma sintering (SPS) on the raw powder, wherein said SPS is performed at an atmosphere of a vacuum of 10-2 to 10-5 torr, a pressure of 30 to 60 MPa, a temperature of 250 to 400° C., and for 30 minutes.

2. The pseudo-ternary thermoelectric material of claim 1, wherein a sintered density is greater than or equal to 99%, and a density deviation is 99.8±0.01%.

3. The pseudo-ternary thermoelectric material of claim 1, wherein a degree of hardness of the center portion is greater than or equal to 30 Vickers hardness (HV) and less than 50 HV, and a degree of hardness of the edge portion is greater than or equal to 50 HV and less than or equal to 80 HV.

4. The pseudo-ternary thermoelectric material of claim 1, comprising a length of 50 millimeters (mm) to 70 mm, a thickness of 30T to 50T, and a weight of 1 kilogram (kg).

5. A thermoelectric element comprising the pseudo-ternary thermoelectric material of claim 1.

6. A thermoelectric module comprising:
a first electrode;
a second electrode; and
the thermoelectric element of claim 5 interposed between the first electrode and the second electrode.

* * * * *